United States Patent
Lin et al.

(10) Patent No.: US 7,304,596 B2
(45) Date of Patent: Dec. 4, 2007

(54) FOLDED MULTI-LSB DECIDED RESISTOR STRING DIGITAL TO ANALOG CONVERTER

(75) Inventors: Wan-Ru Lin, 7F-1, No. 115, Sec. 4, Pa-Te Rd., Sung-Shan Dist., Taipei City (TW); Chun-Chieh Chen, Taoyuan Hsien (TW); Chin-Hung Hsu, Taoyuan Hsien (TW); Nan-Ku Lu, Taipei Hsien (TW)

(73) Assignees: Wan-Ru Lin, Taipei (TW); Chung Yuan Christian University, Tao-Yuan (TW)

( * ) Notice: Subject to any disclaimer, the term of this patent is extended or adjusted under 35 U.S.C. 154(b) by 0 days.

(21) Appl. No.: 11/419,067

(22) Filed: May 18, 2006

(65) Prior Publication Data

US 2006/0261991 A1   Nov. 23, 2006

(30) Foreign Application Priority Data

May 20, 2005   (TW) .............................. 94116759 A

(51) Int. Cl.
*H03M 1/66* (2006.01)
(52) U.S. Cl. ...................................... 341/145; 341/144
(58) Field of Classification Search ................ 341/145, 341/144, 154
See application file for complete search history.

(56) References Cited

U.S. PATENT DOCUMENTS

| | | | | |
|---|---|---|---|---|
| 5,139,782 A | * | 8/1992 | Jung ........................... | 424/401 |
| 5,495,245 A | * | 2/1996 | Ashe ........................... | 341/145 |
| 5,617,091 A | * | 4/1997 | Uda ............................ | 341/154 |
| 6,166,672 A | * | 12/2000 | Park ........................... | 341/145 |
| 6,201,491 B1 | * | 3/2001 | Brunolli et al. ............. | 341/144 |

* cited by examiner

*Primary Examiner*—Peguy JeanPierre
(74) *Attorney, Agent, or Firm*—WPAT, P.C.; Justin I. King

(57) ABSTRACT

A digital-to-analog converter includes: a resistor string; a plurality of first switches each connected between an output node and a corresponding one of first endmost, second endmost and intermediate nodes of the resistor string; a decoding unit adapted for converting a higher-order portion of a digital signal into a decoder signal used to control the first switches such that one of which is selected according to the higher-order portion to connect the corresponding one of the nodes to the output node; and first and second voltage-setting units adapted to be connected between one of first and second reference voltage sources and one of the first and second endmost nodes of the resistor string, and operable in response to a lower-order portion of the digital signal to adjust voltages at the first endmost, second endmost and intermediate nodes of the resistor string according to the lower-order portion of the digital signal.

19 Claims, 9 Drawing Sheets

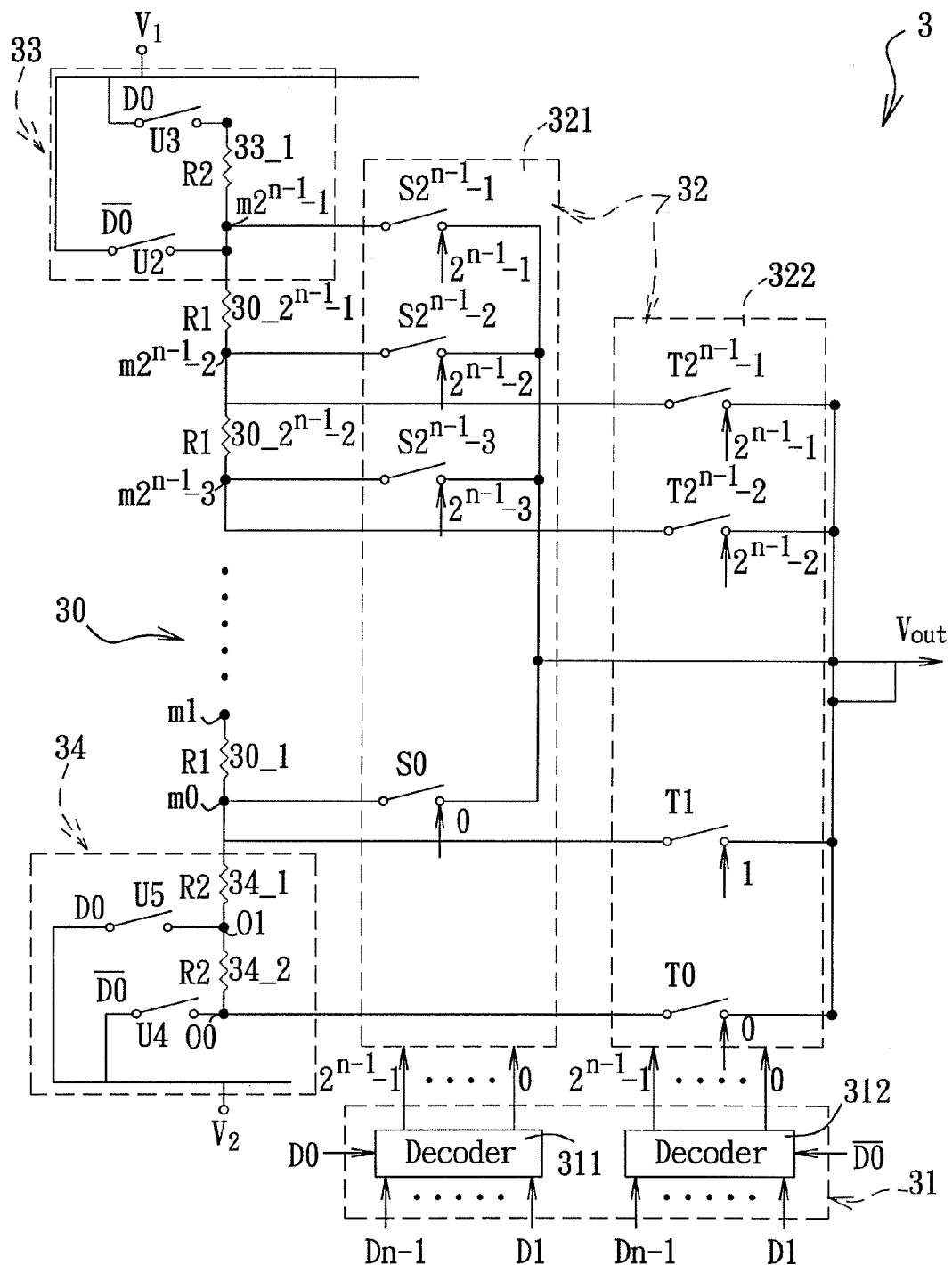
F I G. 3

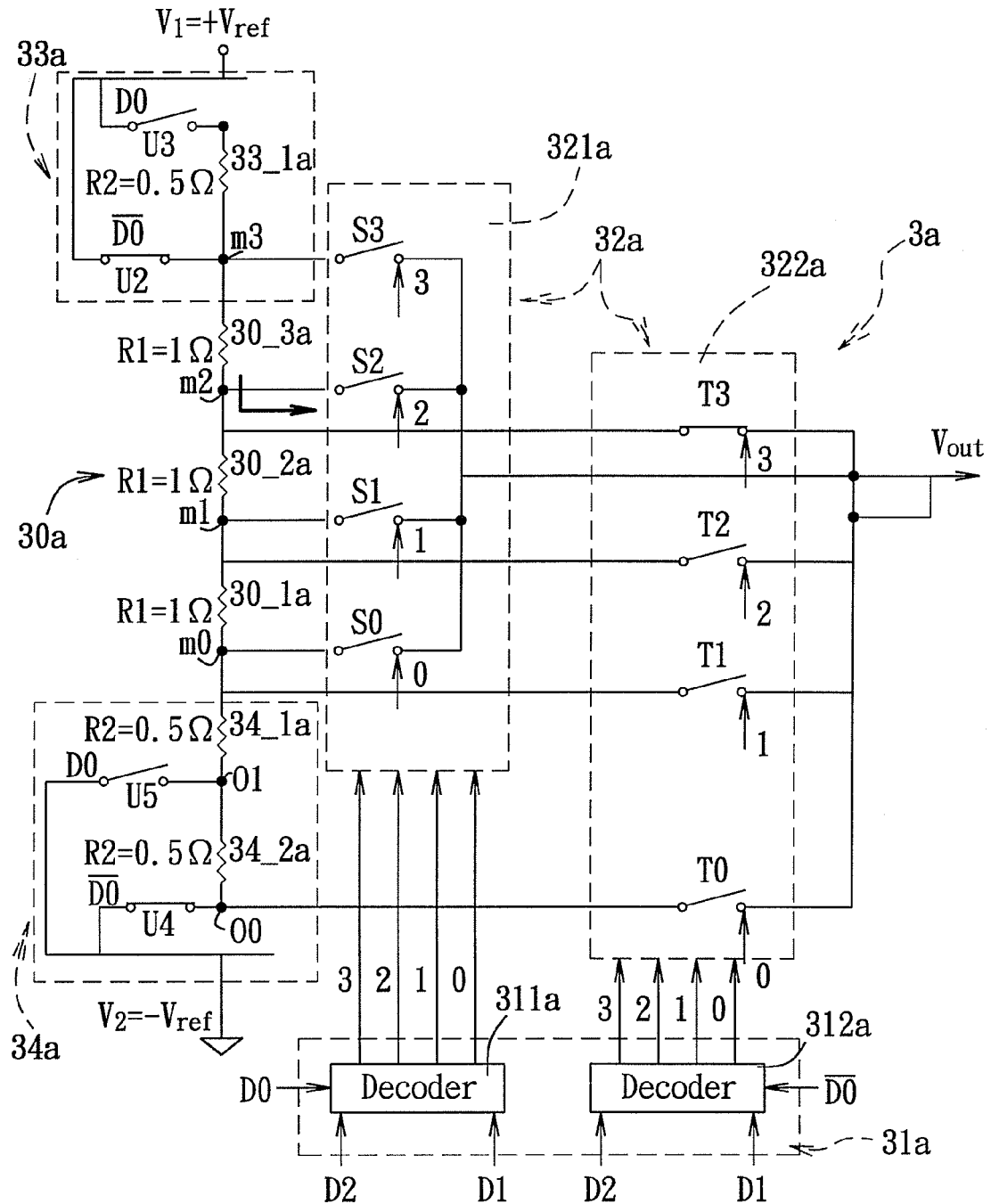
F I G. 4

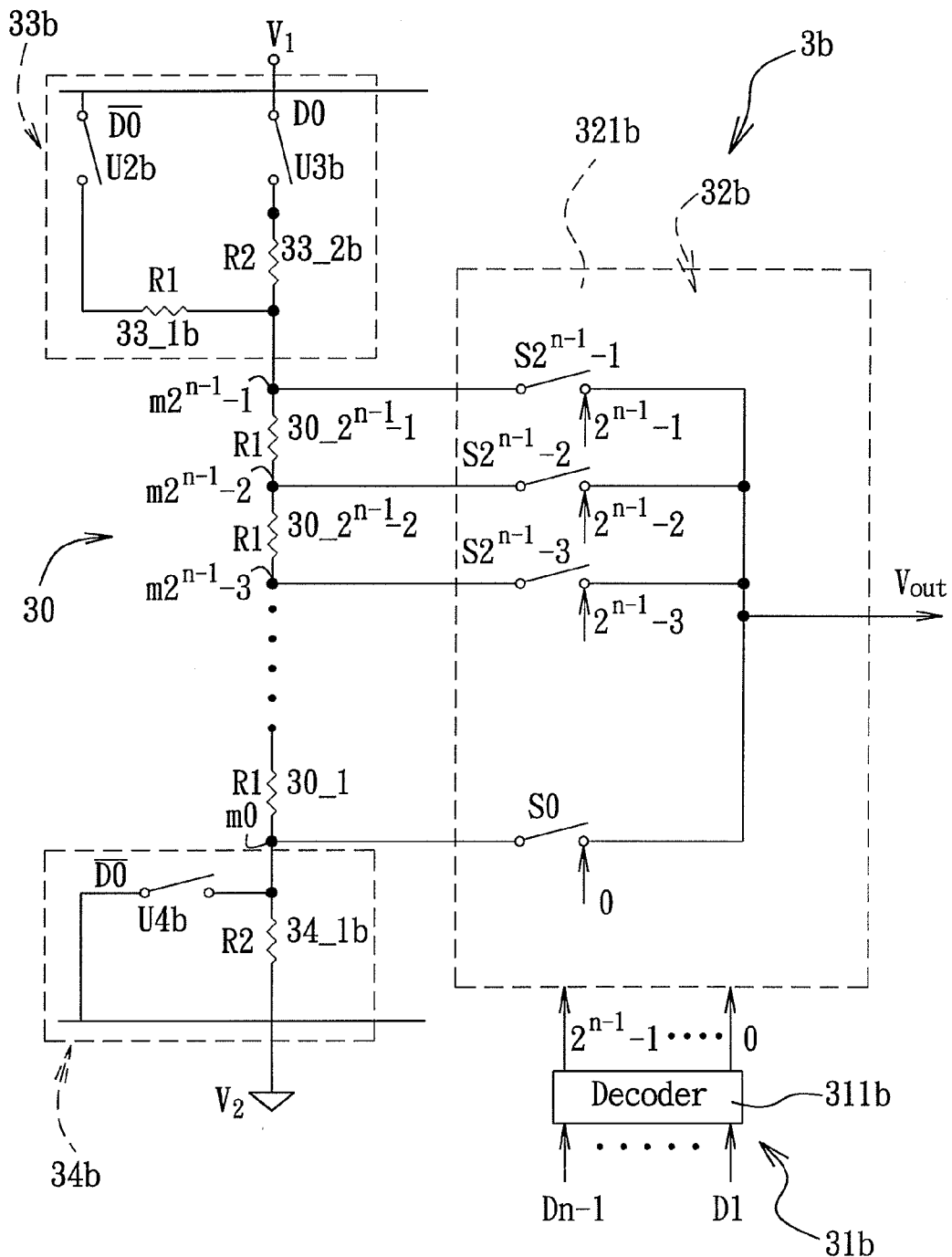
F I G. 5

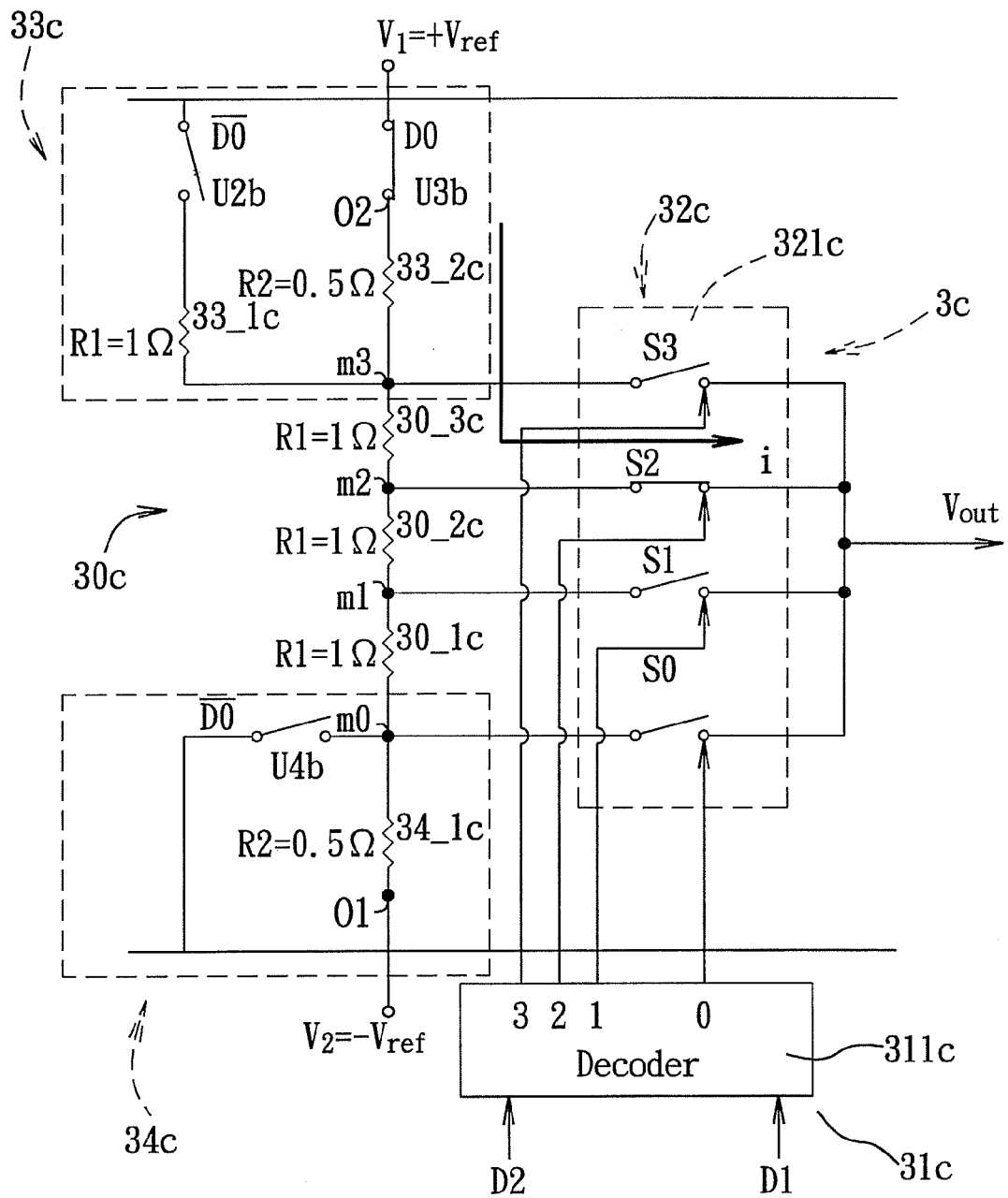
F I G. 6

FOLDED MULTI-LSB DECIDED RESISTOR STRING DIGITAL TO ANALOG CONVERTER

CROSS-REFERENCE TO RELATED APPLICATION

This application claims priority of Taiwanese Application No. 094116759, filed on May 20, 2005.

BACKGROUND OF THE INVENTION

1. Field of the Invention

The invention relates to a digital-to-analog converter, more particularly to a digital-to-analog converter for converting an n-bit digital signal into a corresponding analog signal, controlled by a lower-order signal portion of the n-bit digital signal, and including a relatively small number of passive components such as resistors and switches.

2. Description of the Related Art

Digital-to-analog (D/A) converters are widely used in various integrated circuits, such as in a liquid crystal display driver circuit. As shown in FIG. 1, a conventional D/A converter 1 is adapted to convert an N-bit digital signal into a corresponding analog signal. The conventional D/A converter 1 includes a resistor string 10 including a plurality of resistors (101~108), and a switch multiplexer 11 including a plurality of switches (N0~N7). The resistor string 10 has first and second endmost nodes (n8), (n0), and a plurality of intermediate nodes (n1~n7). Each of the switches (N0~N7) is connected between an output node $V_{out}$ and a respective one of the second endmost and intermediate nodes (n0~n7). The switches (N0~N7) are controlled to open or close in response to the N-bit digital signal (D2, D1, D0) inputted into the switch multiplexer 11 such that one of the switches (N0~N7) is selected to connect a corresponding one of the second endmost and intermediate nodes (n0~n7) to the output node $V_{out}$ in accordance with the digital signal (D2, D1, D0).

With such a circuit architecture, $2^N$ resistors and $2^N$ switches are required, where N represents the bit resolution of the D/A converter. The conventional D/A converter 1 illustrated in FIG. 1 is a 3-bit D/A converter, and therefore eight (since $2^3=8$) resistors (101~108) and eight switches (N0~N7) are required.

Operation of the conventional D/A converter 1 requires application of first and second reference voltage sources $+V_{ref}$, $-V_{ref}$ to the first and second endmost nodes (n8) (n0) of the resistor string 10, respectively. The resistors (101~108), having equal resistances (R), divide a voltage difference $\Delta V$ between the first and second endmost nodes (n8), (n0) into eight equally-sized voltage steps, where $\Delta V=+V_{ref}-(-V_{ref})=2V_{ref}$. Therefore, there is a voltage drop of $$\frac{1}{8}\Delta V$$

across each of the resistors (101~108). In particular, the voltage at the second endmost node (n0) is $-V_{ref}$, and the voltages at the intermediate nodes (n1~n7) are $$\left(-V_{ref}+\frac{1}{8}\Delta V\right),\ \left(-V_{ref}+\frac{2}{8}\Delta V\right),\ \ldots\ \left(-V_{ref}+\frac{7}{8}\Delta V\right),$$

respectively. The digital signal (D2, D1, D0) controls the switches (N0~N7) such that one of the switches (N0~N7) is closed, while the others are opened, to tap the voltage at the respective one of the second endmost and intermediate nodes (n0~n7) to the output node $V_{out}$.

For example, if the digital signal (D2, D1, D0) inputted into the switch multiplexer 11 is "101", a decoder 12 of the switch multiplexer 11 decodes the digital signal (D2, D1, D0) as a hexadecimal "5" that controls the corresponding switch (N5) to close and the rest of the switches (N0~N4, N6~N7) to open such that the voltage $$\left(-V_{ref}+\frac{5}{8}\Delta V\right)$$

at the corresponding intermediate node (n5) is tapped to the output node $V_{out}$.

However, this circuit architecture is only suitable for low-bit resolution applications because of its large chip size, which is attributed to the large required number of resistors and switches that grow in exponential functions of base two, where the exponent is the bit resolution (N), i.e., $2^N$ resistors and $2^N$ switches are required for N-bit resolution.

Shown in FIG. 2 is another 3-bit conventional D/A converter 2 adapted to convert a 3-bit digital signal (D0, D1, D2) into a corresponding analog signal. The 3-bit conventional D/A converter 2 includes a resistor string 20 that includes eight resistors (201~208), and a switch multiplexer 21 including a plurality of first, second and third switches (G0~G7), (G8~G11)., (G12~Gl3). As in the previous conventional D/A converter 1, the resistor string 20 has first and second endmost nodes (n8), (n0), and a plurality of intermediate nodes (n1~n7). Each of the first switches (G0~G7) is connected to a respective one of the second endmost and intermediate nodes (n0~n7), and is operable in response to a least significant bit (D0) of the 3-bit digital signal (D2, D1, D0) to open or close. Each of the second switches (G8~G11) is connected to a corresponding adjacent pair of the first switches (G0~G7), and is operable in response to a middle bit (D1) of the 3-bit digital signal (D2, D1, D0) to open or close. Each of the third switches (G12~Gl3) is connected to a corresponding adjacent pair of the second switches (G8~G11), and is operable in response to a most significant bit (D2) of the 3-bit digital signal (D2, D1, D0) to open or close. For example, if the 3-bit digital signal (D2, D1, D0) inputted into the switch multiplexer 21 is "101", then the switches (G5), (G10), (G13) are closed such that the voltage $$\left(-V_{ref}+\frac{5}{8}\Delta V\right)$$

at the intermediate node (n5) is tapped to the output node $V_{out}$.

Although decoding of this conventional D/A converter 2 is simpler than that of the previous conventional D/A converter 1, the number of resistors and switches required for its operation is still large.

SUMMARY OF THE INVENTION

Therefore, the object of the present invention is to provide a digital-to-analog converter that uses a relatively small number of resistors and switches in order to reduce chip size and manufacturing costs thereof.

According to the present invention, there is provided a digital-to-analog converter that is adapted for converting an n-bit digital signal into a corresponding analog signal. The n-bit digital signal includes higher-order and lower-order signal portions. The digital-to-analog converter has an output node, and includes a resistor string, a plurality of first switches, a decoding unit, and first and second voltage-setting units.

The resistor string includes a plurality of first resistors connected in series. The resistor string has first and second endmost nodes disposed respectively at two ends thereof, and a plurality of intermediate nodes, each disposed between a respective adjacent pair of the first resistors.

Each of the first switches is connected between the output node and a corresponding one of the first endmost, second endmost and intermediate nodes of the resistor string.

The decoding unit is adapted for converting the higher-order signal portion of the n-bit digital signal into a decoder signal. The decoder signal is used to control the plurality of first switches such that one of the first switches is selected in accordance with the higher-order signal portion of the n-bit digital signal to connect the corresponding one of the first endmost, second endmost and intermediate nodes to the output node.

The first voltage-setting unit is adapted to be connected between a first reference voltage source and the first endmost node of the resistor string. The second voltage-setting unit is adapted to be connected between a second reference voltage source and the second endmost node of the resistor string. The first and second voltage-setting units are operable in response to the lower-order signal portion of the n-bit digital signal to adjust voltages at the first endmost, second endmost and intermediate nodes of the resistor string according to the lower-order signal portion of the n-bit digital signal.

BRIEF DESCRIPTION OF THE DRAWINGS

Other features and advantages of the present invention will become apparent in the following detailed description of the preferred embodiments with reference to the accompanying drawings, of which:

FIG. 3 is a schematic electrical circuit diagram of the first preferred embodiment of a digital-to-analog converter according to the present invention;

FIG. 4 is a schematic electrical circuit diagram of a 3-bit digital-to-analog converter according to the first preferred embodiment;

FIG. 5 is a schematic electrical circuit diagram of the second preferred embodiment of a digital-to-analog converter according to the present invention;

FIG. 6 is a schematic electrical circuit diagram of a 3-bit digital-to-analog converter according to the second preferred embodiment;

DETAILED DESCRIPTION OF THE PREFERRED EMBODIMENTS

Figure 1:
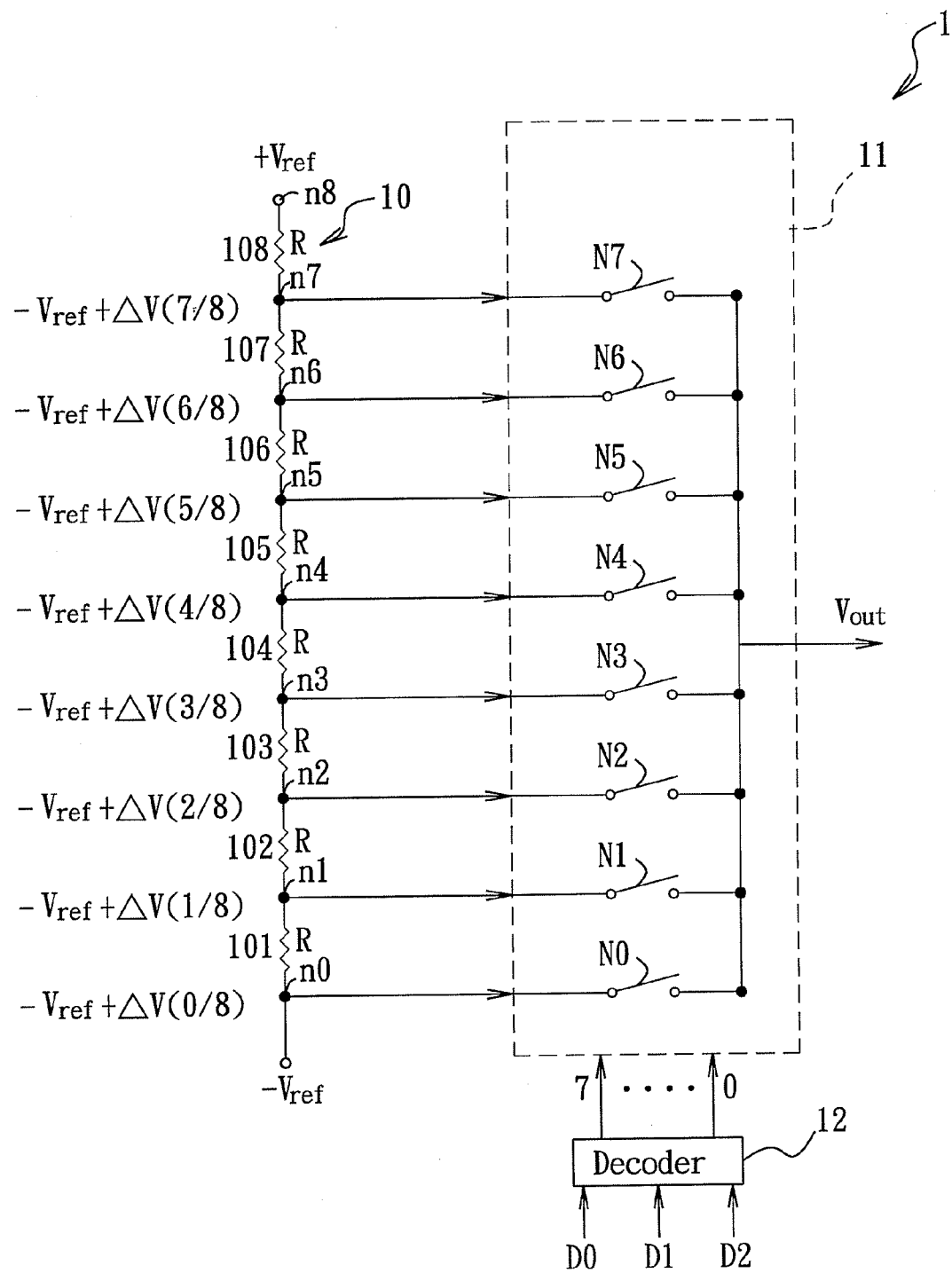
FIG. 1 is a schematic electrical circuit diagram of a conventional digital-to-analog converter.
Figure 2:
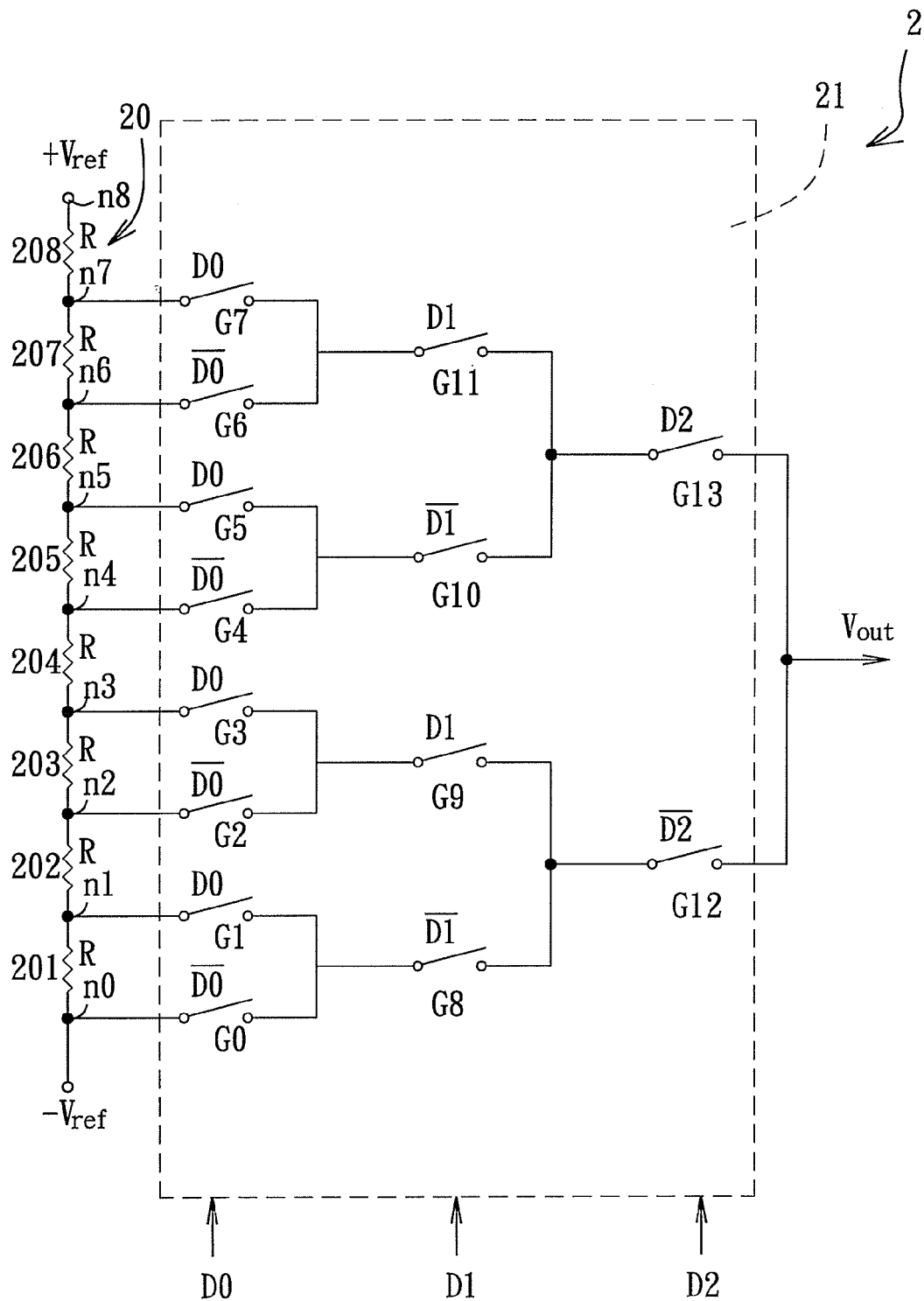
FIG. 2 is a schematic electrical circuit diagram of another conventional digital-to-analog converter.

Before the present invention is described in greater detail, it should be noted herein that like elements are denoted by the same reference numerals throughout the disclosure.

As shown in FIG. 3, the first preferred embodiment of a digital-to-analog converter 3 according to the present invention is adapted for converting an n-bit digital signal (Dn−1, . . . D1, D0) into a corresponding analog signal. The n-bit digital signal (Dn−1, . . . D1, D0) includes higher-order and lower-order signal portions. The digital-to-analog converter 3 has an output node $V_{out}$, and includes a resistor string 30, a plurality of first switches 32, a decoding unit 31, and first and second voltage-setting units 33, 34.

The resistor string 30 includes a plurality of first resistors connected in series. In particular, the resistor string 30 includes $2^{n-1}-1$ first resistors $30\_1, \ldots 30\_2^{n-1}-2, 30\_2^{n-1}-1$ in this embodiment. The resistor string 30 has first and second endmost nodes $(m2^{n-1}-1)$, (m0) disposed respectively at two ends thereof, and a plurality of intermediate nodes (m1), . . . $(m2^{n-1}-3)$, $(m2^{n-1}-2)$ each disposed between a respective adjacent pair of the first resistors $30\_1, \ldots 30\_2^{n-1}-2, 30\_2^{n-1}-1$.

Each of the first switches is connected between the output node $V_{out}$ and a corresponding one of the first endmost, second endmost and intermediate nodes $(m2^{n-1}-1)$, (m0), $(m1 \sim m2^{n-1}-2)$ of the resistor string 30.

The decoding unit 31 is adapted for converting the higher-order signal portion of the n-bit digital signal (Dn−1, . . . D1, D0) into a decoder signal. The decoder signal is used to control the plurality of first switches 32 such that one of the first switches is selected in accordance with the higher-order signal portion of the n-bit digital signal (Dn−1, . . . D1, D0) to connect the corresponding one of the first endmost, second endmost and intermediate nodes $(m2^{n-1}-1)$, (m0), $(m1 \sim m2^{n-1}-2)$ to the output node $V_{out}$.

The first voltage-setting unit 33 is adapted to be connected between a first reference voltage source $V_1$ and the first endmost node $(m2^{n-1}-1)$ of the resistor string 30.

The second voltage-setting unit 34 is adapted to be connected between a second reference voltage source $V_2$ and the second endmost node (m0) of the resistor string 30.

The first and second voltage-setting units 33, 34 are operable in response to the lower-order signal portion of the n-bit digital signal (Dn−1, . . . D1, D0) to adjust voltages at the first endmost, second endmost and intermediate nodes $(m2^{n-1}-1)$, (m0), $(m1 \sim m2^{n-1}-2)$ of the resistor string 30 according to the lower-order signal portion of the n-bit digital signal (Dn−1, . . . D1, D0).

In this embodiment, the lower-order signal portion is a least significant bit (D0) of the n-bit digital signal (Dn−1, . . . D1, D0). The first voltage-setting unit 33 includes a second switch (U2) adapted to connect the first reference voltage source $V_1$ to the first endmost node $(m2^{n-1}-1)$ of the resistor string 30, a third switch (U3) adapted to be connected to the first reference voltage source $V_1$, and a second resistor 33_1 connected directly to the first endmost node (m2$^{n-1}$-1) of the resistor string 30 and adapted to be connected to the first reference voltage source V$_1$ via the third switch (U3).

The second voltage-setting unit 34 includes third and fourth resistors 34_1, 34_2 connected in series. The third resistor 34_1 is further connected directly to the second endmost node (m0) of the resistor string 30. The second voltage-setting unit 34 further includes a fourth switch (U4) adapted to connect the second reference voltage source V$_2$ to one node (O0) of the fourth resistor 34_2 opposite to the third resistor 34_1, and a fifth switch (U5) adapted to connect the second reference voltage source V$_2$ to a junction (O1) of the third and fourth resistors 34_1, 34_2.

In particular, the first resistors 30_1, ... 30_2$^{n-1}$-2, 30_2$^{n-1}$-1 have equal first resistances (R1), and the second, third and fourth resistors 33_1, 34_1, 34_2 have equal second resistances (R2) equal to one-half of the first resistance (R1), i.e., $$R2 = \frac{1}{2}R1.$$

The second and fourth switches (U2), (U4) are closed and the third and fifth switches (U3), (U5) are opened when the least significant bit (D0) of the n-bit digital signal (Dn-1, ... D1, D0) is a logic low bit, i.e., D0=0, $\overline{D0}$=1. The second and fourth switches (U2), (U4) are opened and the third and fifth switches (U3), (U5) are closed when the least significant bit (D0) of the n-bit digital signal (Dn-1, ... D1, D0)) is a logic high bit, i.e., D0=1, $\overline{D0}$=0.

In this embodiment, the plurality of first switches 32 includes a first set 321 of the first switches (S0), (S1), ... (S2$^{n-1}$-2), (S2$^{n-1}$-1), each connected between the output node V$_{out}$ and one of the second endmost, intermediate and first endmost nodes (m0), (m1~m2$^{n-1}$-2), (m2$^{n-1}$-1) of the resistor string 30. The plurality of first switches 32 further includes a second set 322 of the first switches (T0), (T1), ... (T2$^{n-1}$-2), (T2$^{n-1}$-1), each connected between the output node V$_{out}$, and one of the one node (O0) of the fourth resistor 34_2 opposite to the third resistor 34_1, and the second endmost and intermediate nodes (m0), (m1~m2$^{n-1}$-2) of the resistor string 30. Therefore, the total number of the first switches is equal to 2$^{n-1}$×2=2$^n$.

The decoding unit 31 includes first and second decoders 311, 312. Each of the first and second decoders 311, 312 is a (n-1)-bit decoder. The first decoder 311 is enabled when the least significant bit (D0) of the n-bit digital signal (Dn-1, ... D1, D0) is a logic high bit, i.e., D0=1, to convert the higher-order signal portion (Dn-1, ... , D1) of then-bit digital signal (Dn-1, ... D1, D0) into the decoder signal that is used to control the first set 321 of the first switches (S0), ... (S2$^{n-1}$-2), (S2$^{n-1}$-1). In particular, the decoder signal is a corresponding hexadecimal value of the higher-order signal portion (Dn-1, ... , D1) of the n-bit digital signal (Dn-1, ... D1, D0). Thus, the decoder signal ranges from 0 to 2$^{n-1}$-1, and can be used to control one of the first switches (S0), ... (S2$^{n-1}$-2), (S2$^{n-1}$-1) with the corresponding subscript to close. The second decoder 312 is enabled when the least significant bit (D0) of the n-bit digital signal (Dn-1, ... D1, D0) is a logic low bit, i.e., $\overline{D0}$=1, to convert the higher-order signal portion (Dn-1, ... , D1) of the n-bit digital signal (Dn-1, ... D1, D0) into the decoder signal that is used to control the second set 322 of the first switches (T0), ... (T2$^{n-1}$-2), (T2$^{n-1}$-1) In particular, the decoder signal is the corresponding hexadecimal value of the higher-order signal portion (Dn-1, ... , D1) of the n-bit digital signal (Dn-1, ... D1, D0) Thus, the decoder signal ranges from 0 to 2$^{n-1}$-1, and can be used to control one of the first switches (T0), ... (T2$^{n-1}$-2), (T2$^{n-1}$-1) with the corresponding subscript to close.

Shown in FIG. 4 is the first preferred embodiment when n=3, i.e., it is a 3-bit digital-to-analog converter 3a according to the first preferred embodiment. A 3-bit digital signal (D2, D1, D0) is inputted into the 3-bit digital-to-analog converter 3a to be converted into a corresponding analog signal. In particular, the resistor string 30a includes three first resistors 30_1a, 30_2a, 30_3a. Each of the first and second decoders 311a, 312a of the decoding unit 31a is a 2-bit decoder since n-1=3-1=2.

The least significant bit (D0) of the 3-bit digital signal (D2, D1, D0) is used to control the second, third, fourth and fifth switches (U2), (U3), (U4), (U5), and to enable the first and second decoders 311a, 312a. On the other hand, the higher-order signal portion (D2, D1) of the 3-bit digital signal (D2, D1, D0) is converted by the first and second decoders 311a, 312a into the decoder signals that are used to control respectively the first set 321a of the first switches (S0), (S1), (S2), (S3) and the second set 322a of the first switches (T0), (T1), (T2), (T3). In this example, the decoder signal ranges from 0 to 3.

It is assumed that the 3-bit digital signal (D2, D1, D0) received by the 3-bit digital-to-analog converter 3a is "110", that the first resistance (R1) of each of the first resistors 30_1a, 30_2a, 30_3a is equal to 1Ω. that the second resistance (R2) of each of the second, third and fourth resistors 33_1a, 34_1a, 34_2a is equal to 0.5 Ω, and that the first and second reference voltage sources V$_1$, V$_2$ have voltages equal to +V$_{ref}$, -V$_{ref}$, respectively.

Since the least significant bit (D0) is a logic low bit, i.e., D0=0, $\overline{D0}$=1, the second switch (U2) of the first voltage-setting unit 33a and the fourth switch (U4) of the second voltage-setting unit 34a are closed, and the third switch (U3) of the first voltage setting unit 33a and the fifth switch (U5) of the second voltage-setting unit 34a are opened, such that a voltage difference ΔV between the first and second reference voltage sources V$_1$, V$_2$ is applied across the first endmost node (m3) of the resistor string 30a and the one node (O0) of the fourth resistor 34_2a that is opposite to the third resistor 34_1a, where ΔV=V$_1$-V$_2$=+V$_{ref}$-(-V$_{ref}$)=2V$_{ref}$. By voltage division, the node voltages for D0=0 are obtained as tabulated in Table 1 below.

TABLE 1

| Node | Node Voltages when D0 = 0 |
|---|---|
| | Node Voltage |
| m3 | +V$_{ref}$ |
| m2 | $+V_{ref} - \frac{R1}{R1 \times 3 + R2 \times 2}\Delta V = V_{ref} - \frac{1}{1 \times 3 + 0.5 \times 2}2V_{ref} = \frac{1}{2}V_{ref}$ |
| m1 | $+V_{ref} - \frac{R1 \times 2}{R1 \times 3 + R2 \times 2}\Delta V = V_{ref} - \frac{2}{4}2V_{ref} = 0$ |
| m0 | $+V_{ref} - \frac{R1 \times 3}{R1 \times 3 + R2 \times 2}\Delta V = V_{ref} - \frac{3}{4}2V_{ref} = -\frac{1}{2}V_{ref}$ |
| O1 | $+V_{ref} - \frac{R1 \times 3 + R2}{R1 \times 3 + R2 \times 2}\Delta V = V_{ref} - \frac{3.5}{4}2V_{ref} = -\frac{3}{4}V_{ref}$ |
| O0 | -V$_{ref}$ |

In addition, since $\overline{D0}=1$, the second decoder 312a is enabled to convert the higher-order signal portion (D2, D1) of the 3-bit digital signal (D2, D1, D0) into the decoder signal that is used to control the second set 322a of the first switches (T0), (T1), (T2), (T3). The decoder signal is the corresponding hexadecimal value of the higher-order signal portion (D2, D1) of the 3-bit digital signal (D2, D1, D0). In this case, since the higher-order signal portion (D2, D1) is "11". the decoder signal is a hexadecimal "3". Therefore, the corresponding first switch (T3) of the second set 322a of first switches (T0), (T1), (T2), (T3) is closed, while the other switches (T0), (T1), (T2) are opened, such that the voltage at the intermediate node (m2) is tapped to the output node $V_{out}$. In other words, the voltage at the output node $V_{out}$ is $$\frac{1}{2}V_{ref}.$$

Shown below in Table 2 is the voltage at the output node $V_{out}$ for all possible values of the 3-bit digital signal (D2, D1, D0) inputted into the 3-bit digital-to-analog converter 3a.

TABLE 2

Output Voltages

| D2, D1, D0 | $V_{out}$ |
|---|---|
| 1 1 1 | $\frac{3}{4}V_{ref}$ |
| 1 1 0 | $\frac{1}{2}V_{ref}$ |
| 1 0 1 | $\frac{1}{4}V_{ref}$ |
| 1 0 0 | 0 |
| 0 1 1 | $-\frac{1}{4}V_{ref}$ |
| 0 1 0 | $-\frac{1}{2}V_{ref}$ |
| 0 0 1 | $-\frac{3}{4}V_{ref}$ |
| 0 0 0 | $-V_{ref}$ |

Therefore, according to the first preferred embodiment, to convert an n-bit digital signal into its corresponding analog signal, the total number of resistors required is $(2^{n-1}-1)+4=2^{n-1}+3$, while the total number of switches required is $(2^{n-1}\times2)+4=2^n+4$. In addition, only two (n−1)-bit decoders 311, 312 are required. As a result, chip size of the digital-to-analog converter 3 is reduced as compared to the prior art, thereby permitting application to high-resolution digital-to-analog conversions.

As shown in FIG. 5, the second preferred embodiment of a digital-to-analog converter 3b according to the present invention differs from the first preferred embodiment mainly in the configurations of the first and second voltage-setting units 33b, 34b. In this embodiment, the first voltage-setting unit 33b includes second and third resistors 33_1b, 33_2b connected directly to the first endmost node ($m2^{n-1}-1$) of the resistor string 30, and second and third switches (U2b), (U3b) adapted to connect the second and third resistors 33_1b, 33_2b respectively to the first reference voltage source $V_1$. The second voltage-setting unit 34b includes a fourth switch (U4b) and a fourth resistor 34_1b, each of which is adapted to connect the second endmost node (m0) of the resistor string 30 to the second reference voltage source $V_2$.

In particular, the first and second resistors 30_1, . . . 30_$2^{n-1}$-2, 30_$2^{n-1}$-1, 33_1b have equal first resistances (R1), and the third and fourth resistors 33_2b, 34_1b have equal second resistances (R2) equal to one-half of the first resistance (R1), i.e., $$R2 = \frac{1}{2}R1.$$

The second and fourth switches (U2b), (U4b) are closed and the third switch (U3b) is opened when the least significant bit (D0) of the n-bit digital signal (Dn−1, . . . D1, D0) is a logic low bit, i.e., D0=0. $\overline{D0}=1$. The second and fourth switches (U2b), (U4b) are opened and the third switch (U3b) is closed when the least significant bit (D0) of the n-bit digital signal (Dn−1, . . . D1, D0) is a logic high bit, i.e., D0=1, $\overline{D0}=0$.

Moreover, the second preferred embodiment is also different from the first preferred embodiment in the configuration of the plurality of first switches 32b. In this embodiment, the plurality of first switches 32b includes only the one set 321b of the first switches (S0) (S1), . . . ($S2^{n-1}$-2), ($S2^{n-1}$-1), each connected between the output node $V_{out}$ and one of the second endmost, intermediate and first endmost nodes (m0), (m1~m$2^{n-1}$-2), (m$2^{n-1}$-1) of the resistor string 30. Therefore, the total number of the first switches is equal to $2^{n-1}$. In addition, unlike the first preferred embodiment, the decoding unit 31b includes only one (n−1)-bit decoder 311b that converts the higher-order signal portion (Dn−1, . . . , D1) of the n-bit digital signal (Dn−1, . . . D1, D0) into the decoder signal, which is a corresponding hexadecimal value of the higher-order signal portion (Dn−1, . . . , D1) of the n-bit digital signal (Dn−1, . . . D1, D0). The decoder signal ranges from 0 to $2^{n-1}$-1, and is used to control the one set 321b of the first switches (S0), . . . ($S2^{n-1}$-2), ($S2^{n-1}$-1).

Shown in FIG. 6 is the second preferred embodiment when n=3, i.e., it is a 3-bit digital-to-analog converter 3c according to the second preferred embodiment. In particular, the resistor string 30c includes three first resistors 30_1c, 30_2c, 30_3c. The (n−1)-bit decoder 311c of the decoding unit 31c is a 2-bit decoder since n−1=3−1=2. A 3-bit digital signal (D2, D1, D0) is inputted into the 3-bit digital-to-analog converter 3c to be converted into a corresponding analog signal. The least significant bit (D0) of the 3-bit digital signal (D2, D1, D0) is used to control the second, third and fourth switches (U2b), (U3b), (U4b), while the higher-order signal portion (D2, D1) of the 3-bit digital signal (D2, D1, D0) is converted by the 2-bit decoder 311c into the decoder signal that is used to control the one set 321c of the first switches (S0), (S1), (S2), (S3). In this example, the decoder signal ranges from 0 to 3.

It is assumed that the 3-bit digital signal (D2, D1, D0) received by the 3-bit digital-to-analog converter 3c is "101", that the first resistance (R1) of each of the first and second resistors 30_1c, 30_2c, 30_3c, 33_1c is equal to 1Ω, that the second resistance (R2) of each of the third and fourth resistors 33_2c, 34_1c is equal to 0.5Ω, and that the first and second reference voltage sources $V_1$, $V_2$ have voltages equal to $+V_{ref}$, $-V_{ref}$, respectively.

Since the least significant bit (D0) is a logic high bit, i.e., D0=1, the third switch (U3b) of the first voltage-setting unit 33c is closed, while the second switch (U2b) of the first voltage-setting unit 33c and the fourth switch (U4b) of the second voltage-setting unit 34c are opened, such that a voltage difference ΔV between the first and second reference voltage sources $V_1$, $V_2$ is applied across a node (O2) of the third resistor 33_2c opposite to the first endmost node (m3) of the resistor string 30c, and a node (O1) of the fourth resistor 34_1c opposite to the second endmost node (m0), where $\Delta V = +V_{ref} - (-V_{ref}) = 2V_{ref}$. By voltage division, the node voltages for D0=1 are obtained as tabulated in Table 3 below.

TABLE 3

Node Voltages when D0 = 1

| Node | Node Voltage |
|---|---|
| O2 | $+V_{ref}$ |
| m3 | $+V_{ref} - \dfrac{R2}{R1 \times 3 + R2 \times 2} \Delta V = V_{ref} - \dfrac{0.5}{1 \times 3 + 0.5 \times 2} 2V_{ref} = \dfrac{3}{4} V_{ref}$ |
| m2 | $+V_{ref} - \dfrac{R2 + R1}{R1 \times 3 + R2 \times 2} \Delta V = V_{ref} - \dfrac{1.5}{4} 2V_{ref} = \dfrac{1}{4} V_{ref}$ |
| m1 | $+V_{ref} - \dfrac{R2 + R1 \times 2}{R1 \times 3 + R2 \times 2} \Delta V = V_{ref} - \dfrac{2.5}{4} 2V_{ref} = -\dfrac{1}{4} V_{ref}$ |
| m0 | $+V_{ref} - \dfrac{R2 + R1 \times 3}{R1 \times 3 + R2 \times 2} \Delta V = V_{ref} - \dfrac{3.5}{4} 2V_{ref} = -\dfrac{3}{4} V_{ref}$ |
| O1 | $-V_{ref}$ |

In addition, the decoder signal is the corresponding hexadecimal value of the higher-order signal portion (D2, D1) of the 3-bit digital signal (D2, D1, D0). In this case, since the higher-order signal portion (D2, D1) is "10", the decoder signal is a hexadecimal "2". Therefore, the corresponding first switch (S2) of the one set 321c of first switches (S0), (S1), (S2), (S3) is closed, while the other first switches (S0), (S1), (S3) are opened, such that the voltage at the intermediate node (m2) of the resistor string 30c is tapped to the output node $V_{out}$. In other words, voltage at the output node $V_{out}$ is $$\frac{1}{4} V_{ref}.$$

The voltages at the output node $V_{out}$ for all possible values of the 3-bit digital signal (D2, D1, D0) inputted into the 3-bit digital-to-analog converter 3c are identical to those shown in Table 2 for the 3-bit digital-to-analog converter 3a.

Therefore, according to the second preferred embodiment, to convert an n-bit digital signal into its corresponding analog signal, the total number of resistors required is $(2^{n-1}-1)+3=2^{n-1}+2$, while the total number of switches required is $2^{n-1}+3$. In addition, only one (n−1)-bit decoder 311b is required. As a result, chip size of the digital-to-analog converter 3b is reduced as compared to the prior art, thereby permitting application to high-resolution digital-to-analog conversions.

Figure 7:
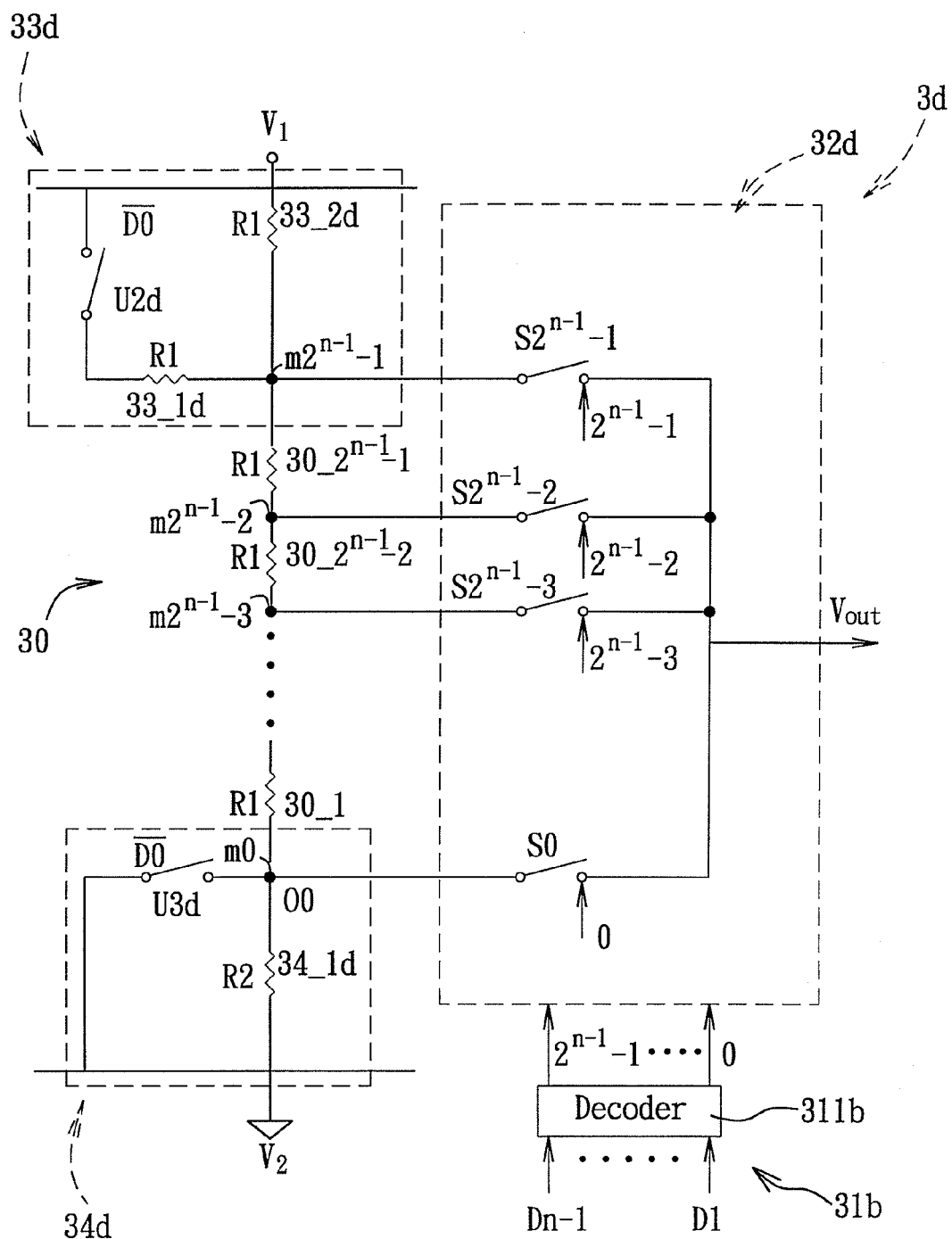
FIG. 7 is a schematic electrical circuit diagram of the third preferred embodiment of a digital-to-analog converter according to the present invention.

As shown in FIG. 7, the third preferred embodiment of a digital-to-analog converter 3d according to the present invention differs from the second preferred embodiment in the first and second voltage-setting units 33d, 34d. The first voltage-setting unit 33d includes a second switch (U2d) adapted to be connected to the first reference voltage source $V_1$, a second resistor 33_1d connected directly to the first endmost node (m$2^{n-1}$-1) of the resistor string 30 and adapted to be connected to the first reference voltage source $V_1$ via the second switch (U2d), and a third resistor 33_2d adapted to connect directly the first endmost node (m$2^{n-1}$-1) of the resistor string 30 to the first reference voltage source $V_1$. The second voltage-setting unit 34d includes a third switch (U3d) and a fourth resistor 34_1d, each of which is adapted to connect the second endmost node (m0) of the resistor string 30 to the second reference voltage source $V_2$.

In particular, the first, second and third resistors 30_1, ..., 30_$2^{n-1}$-2, 30_$2^{n-1}$-1, 33_1d, 33_2d have equal first resistances (R1), and the fourth resistor 34_1d has a second resistance (R2) equal to one-half of the first resistance (R1), i.e., $$R2 = \frac{1}{2} R1.$$

The second and third switches (U2d) (U3d) are closed when the least significant bit (D0) of the n-bit digital signal (Dn−1, ... D1, D0) is a logic low bit, i.e., D0=0. $\overline{D0}$=1, and are opened when otherwise. After the (n−1)-bit decoder 311b of the decoding unit 31b converts the higher-order signal portion (Dn−1, ..., D1) of the n-bit digital signal (Dn−1, ... D1, D0) into the decoder signal to control one of the first switches (S0), ... (S$2^{n-1}$-2), (S$2^{n-1}$-1) to close, voltage at the corresponding one of the second endmost, intermediate and first endmost nodes (m0), (m1~m$2^{n-1}$-2), (m$2^{n-1}$-1) of the resistor string 30 is obtained by voltage division, and is tapped to the output node $V_{out}$.

Therefore, according to the third preferred embodiment, to convert an n-bit digital signal into its corresponding analog signal, the total number of resistors required is $(2^{n-1}-1)+3=2^{n-1}+2$, and the total number of switches required is $2^{n-1}+2$. In addition, only one (n−1)-bit decoder 311b is required. As a result, chip size of the digital-to-analog converter 3d is reduced as compared to the prior art, thereby permitting application to high-resolution digital-to-analog conversions.

Figure 8:
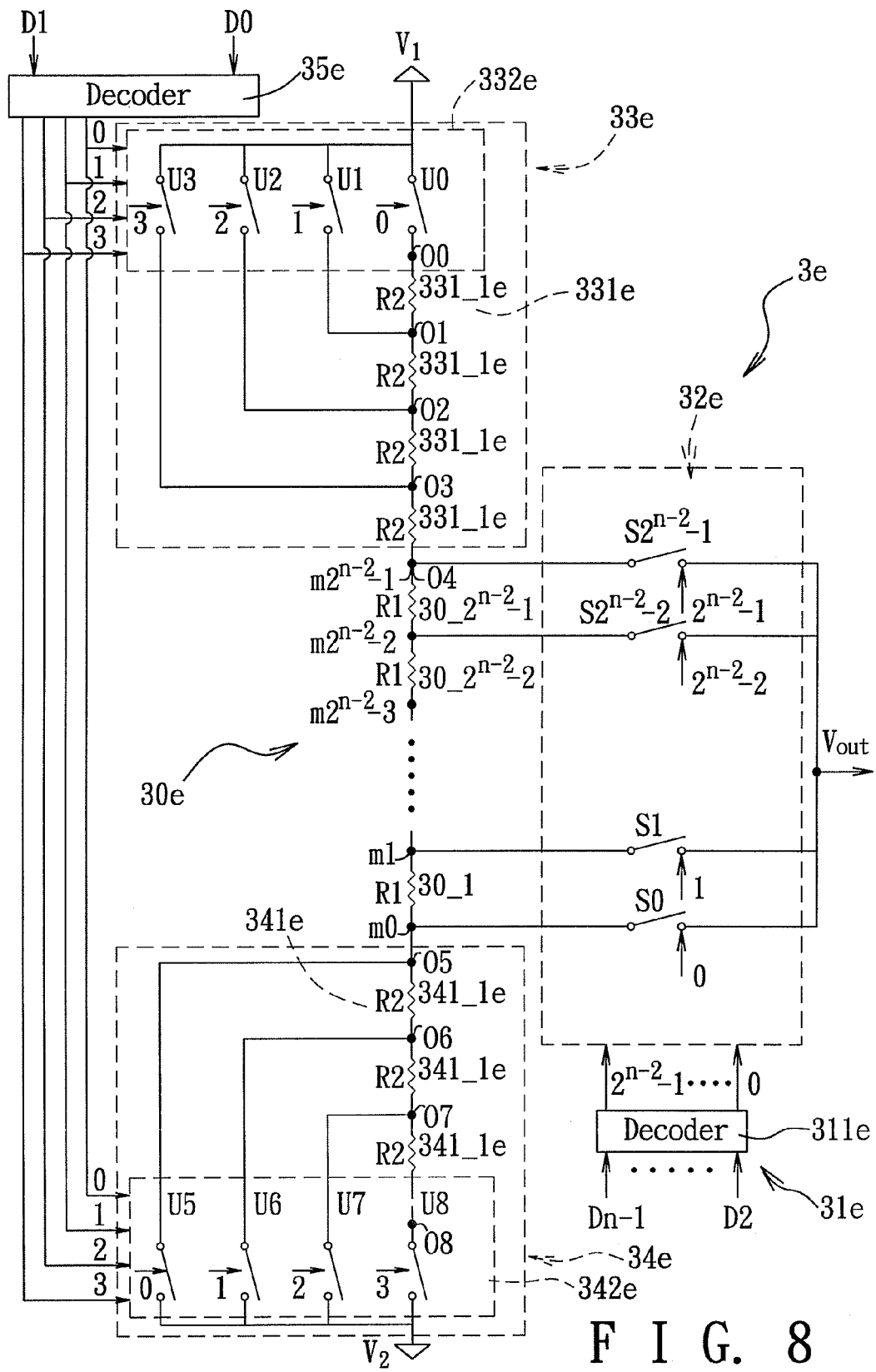
FIG. 8 is a schematic electrical circuit diagram of the fourth preferred embodiment of a digital-to-analog converter according to the present invention.

As shown in FIG. 8, the fourth preferred embodiment of a digital-to-analog converter 3e according to the present invention differs from the second preferred embodiment in that the lower-order signal portion is the least two significant bits (D1, D0) of the n-bit digital signal (Dn−1, ... D1, D0). The resistor string 30e includes $2^{n-2}$-1 first resistors 30_1, ... 30_$2^{n-2}$-2, 30_$2^{n-2}$-1 connected in series. The resistor string 30e has first and second endmost nodes (m$2^{n-2}$-1), (m0) disposed respectively at two ends thereof, and a plurality of intermediate nodes (m1), ... (m$2^{n-2}$-3), (m$2^{n-2}$-2), each disposed between a respective adjacent pair of the first resistors 30_1, ... 30_$2^{n-2}$-2, 30_$2^{n-2}$-1. Correspondingly, the plurality of first switches 32e includes $2^{n-2}$-1 first switches (S0), ... (S$2^{n-2}$-2), (S$2^{n-2}$-1), each of which is connected between the output node $V_{out}$ and a corresponding one of the second endmost, intermediate and first endmost nodes (m0), (m1~m$2^{n-2}$-2), (m$2^{n-2}$-1) of the resistor string 30e. The decoding unit 31e includes one (n−2)-bit decoder 311e that converts the higher-order signal portion (Dn−1, . . . , D2) of the n-bit digital signal (Dn−1, . . . D1, D0) into the decoder signal, which is a corresponding hexadecimal value of the higher-order signal portion (Dn−1, . . . , D2) of the n-bit digital signal (Dn−1, . . . D1, D0) The decoder signal ranges from 0 to $2^{n-2}-1$, and is used to control the first switches (S0), . . . ($S2^{n-2}-2$), ($S2^{n-2}-1$).

Further, the first voltage-setting unit 33e includes a second resistor string 331e and a first switch set 332e. The second resistor string 331e includes four second resistors 331_1e connected in series, and has first and second terminating nodes (O0), (O4) disposed respectively at opposite ends of the second resistor string 331e and three first middle nodes (O1), (O2), (O3) each disposed between a respective adjacent pair of the second resistors 331_1e. The second terminating node (O4) is connected directly to the first endmost node ($m2^{n-2}-1$) of the resistor string 30e. The first switch set 332e includes four second switches (U0), (U1), (U2), (U3) each adapted to connect a respective one of the first terminating and first middle nodes (O0), (O1), (O2), (O3) to the first reference voltage source $V_1$.

The second voltage-setting unit 34e includes a third resistor string 341e and a second switch set 342e. The third resistor string 341e includes three third resistors 341_1e connected in series, and has third and fourth terminating nodes (O5), (O8) disposed respectively at opposite ends of the third resistor string 341e and two second middle nodes (O6), (O7) each disposed between a respective adjacent pair of the third resistors 341_1e. The third terminating node (O5) is connected directly to the second endmost node (m0) of the resistor string 30e. The second switch set 342e includes four third switches (U5), (U6), (U7), (U8) each adapted to connect a respective one of the third terminating, second middle and fourth terminating nodes (O5), (O6), (O7), (O8) to the second reference voltage source $V_2$.

The digital-to-analog converter 3e according to the fourth preferred embodiment further includes a second decoder 35e for converting the least two significant bits (D1, D0) of the n-bit digital signal (Dn−1, . . . D1, D0) into a control signal. The control signal is used to control the second switches (U0), (U1), (U2), (U3) such that one of the second switches (U0), (U1), (U2), (U3) is selected in accordance with the least two significant bits (D1, D0) of the n-bit digital signal (Dn−1, . . . D1, D0) for connecting the corresponding one of the first terminating and first middle nodes (O0), (O1), (O2), (O3) to the first reference voltage source $V_1$. The control signal is further used to control the third switches (U5), (U6), (U7), (U8) such that one of the third switches (U5), (U6), (U7), (U8) is selected in accordance with the least two significant bits (D1, D0) of the n-bit digital signal (Dn−1, . . . D1, D0) for connecting the corresponding one of the third terminating, second middle, and fourth terminating nodes (O5), (O6), (O7), (O8) to the second reference voltage source $V_2$.

More particularly, the control signal is the hexadecimal value of the least two significant bits (D1, D0) of the n-bit digital signal (Dn−1, . . . D1, D0). When the control signal is a hexadecimal "0", the second switch (U0) and the third switch (U5) are closed such that a voltage difference ΔV between the first and second reference voltages $V_1$, $V_2$ is applied across the first and third terminating nodes (O0), (O5), where $ΔV=V_1-V_2$. When the control signal is a hexadecimal "1". the second switch (U1) and the third switch (U6) are closed such that the voltage difference ΔV is applied across the first and second middle nodes (O1), (O6). When the control signal is a hexadecimal "2", the second switch (U2) and the third switch (U7) are closed such that the voltage difference ΔV is applied across the first and second middle nodes (O2), (O7). When the control signal is a hexadecimal "3", the second switch (U3) and the third switch (U8) are closed such that the voltage difference ΔV is applied across the first middle node (O3) and the fourth terminating node (O8).

In this embodiment, the first resistors 30_1, . . . 30_$2^{n-2}$-2, 30_$2^{n-2}$-1 have equal first resistances (R1), and the second and third resistors 331_1e, 341_1e have equal second resistances (R2) equal to one-fourth of the first resistance (R1), i.e., $$R2 = \frac{1}{4}R1.$$

After the (n−2)-bit decoder 311e converts the higher-order signal portion (Dn−1, . . . , D2) of the n-bit digital signal (Dn−1, . . . D1, D0) into the decoder signal to control one of the first switches (S0), . . . ($S2^{n-2}-2$), ($S2^{n-2}-1$) to close, voltage at the corresponding one of the second endmost, intermediate and first endmost nodes (m0), (m1~$m2^{n-2}-2$), ($m2^{n-2}-1$) of the resistor string 30e is obtained by voltage division, and is tapped to the output node $V_{out}$.

Therefore, according to the fourth preferred embodiment, to convert an n-bit digital signal into its corresponding analog signal, the total number of resistors required is $(2^{n-2}-1)+4+3=2^{n-2}+6$, while the total number of switches required is $2^{n-2}+4+4=2^{n-2}+8$. In addition, only one (n−2)-bit decoder 311e and one 2-bit decoder 35e are required for generating respectively the decoder and control signals. As a result, chip size of the digital-to-analog converter 3e is reduced as compared to the prior art, thereby permitting application to high-resolution digital-to-analog conversions.

Figure 9:
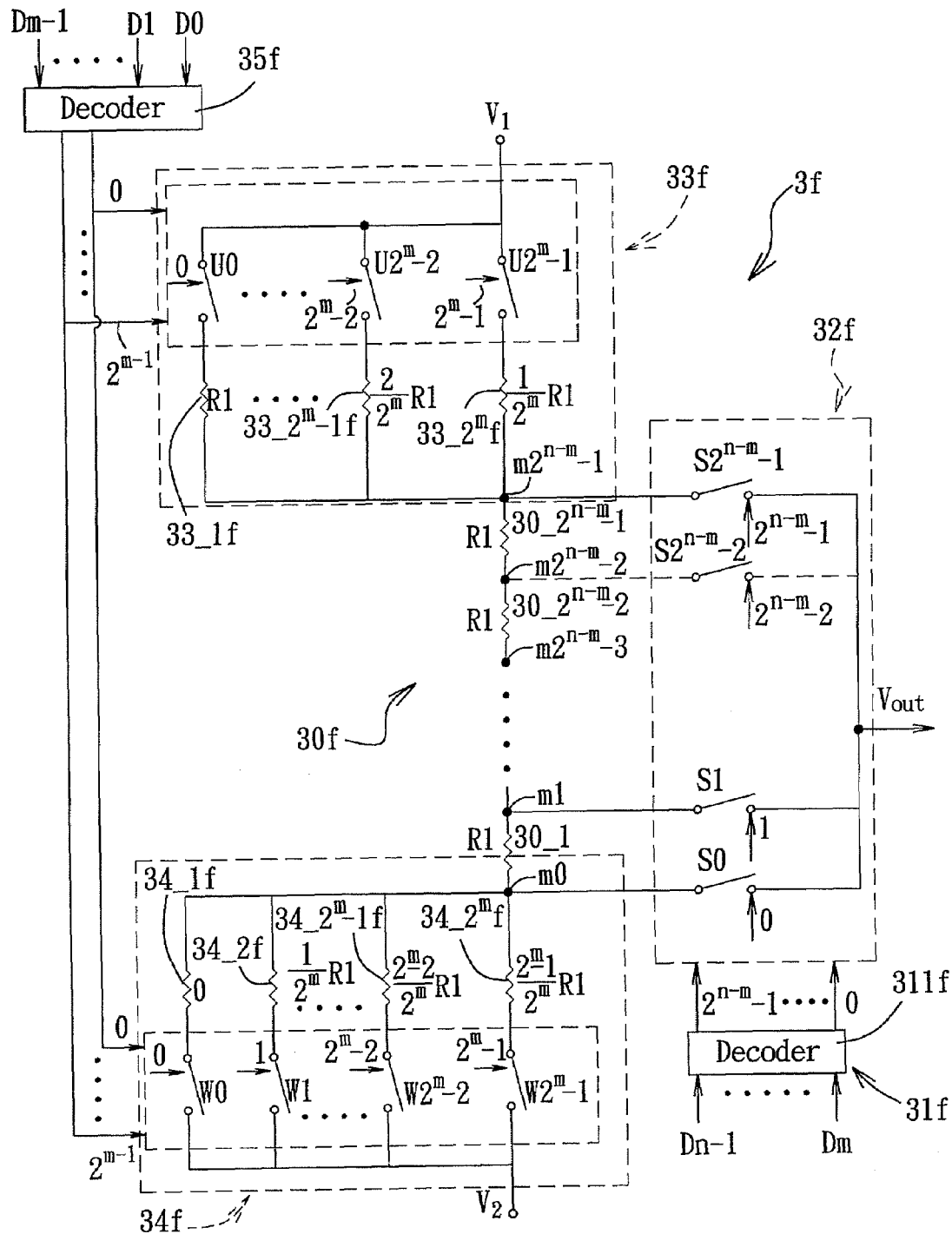
FIG. 9 is a schematic electrical circuit diagram of the fifth preferred embodiment of a digital-to-analog converter according to the present invention.

As shown in FIG. 9, the fifth preferred embodiment of a digital-to-analog converter 3f according to the present invention differs from the second preferred embodiment in that the lower-order signal portion is the least (m) significant bits (Dm−1, . . . D1, D0) of the n-bit digital signal (Dn−1, . . . D1, D0), where (m) is a positive integer less than (n) The resistor string 30f includes $2^{n-m}-1$ first resistors 30_1, . . . , 30_$2^{n-m}$-2, 30_$2^{n-m}$-1 connected in series. The resistor string 30f has first and second endmost nodes ($m2^{n-m}-1$), (m0) disposed respectively at two ends thereof, and a plurality of intermediate nodes (m1), . . . , ($m2^{n-m}-3$), ($m2^{n-m}-2$), each disposed between a respective adjacent pair of the first resistors 30_1, . . . 30_$2^{n-m}$-2, 30_$2^{n-m}$-1. Correspondingly, the plurality of first switches 32f includes $2^{n-m}-1$ first switches (S0), . . . ($S2^{n-m}-2$), ($S2^{n-m}-1$), each of which is connected between the output node $V_{out}$ and a corresponding one of the second endmost, intermediate and first endmost nodes (m0), (m1~$m2^{n-m}-2$), ($m2^{n-m}-1$) of the resistor string 30f. The decoding unit 31f includes one (n−m)-bit decoder 311f that converts the higher-order signal portion (Dn−1, . . . , Dm) of the n-bit digital signal (Dn−1, . . . D1, D0) into the decoder signal that is used to control the first switches (S0), . . . , ($S2^{n-m}-2$), ($S2^{n-m}-1$). In particular, the decoder signal is a corresponding hexadecimal value of the higher-order signal portion (Dn−1, . . . , Dm) of the n-bit digital signal (Dn−1, . . . D1, D0). Thus, the decoder signal ranges from 0 to $2^{n-m}-1$.

Further, the first voltage-setting unit 33f includes $2^m$ second switches (U0), . . . ($U2^m-2$), ($U2^m-1$) adapted to be connected to the first reference voltage source $V_1$, and $2^m$ first resistive branches 33_1f, . . . , 33_$2^m-1f$, 33_$2^mf$ connected directly to the first endmost node ($m2^{n-m}-1$) of the resistor string 30f and adapted to be connected to the first reference voltage source $V_1$ via a respective one of the second switches (U0), ... (U$2^m$–2), (U$2^m$–1).

The second voltage-setting unit 34f includes $2^m$ third switches (W0), ... (W$2^m$-2), (W$2^m$-1) adapted to be connected to the second reference voltage source $V_2$, and $2^m$ second resistive branches 34_1f, ... 34_$2^m$-1f, 34_$2^m$ connected directly to the second endmost node (m0) of the resistor string 30f and adapted to be connected to the second reference voltage source $V_2$ via a respective one of the third switches (W0), ... (W$2^m$-2), (W$2^m$-1).

The digital-to-analog converter 3f according to the fifth preferred embodiment further includes a second decoder 35f for converting the least (m) significant bits (Dm, ... D1, D0) of the n-bit digital signal (Dn–1, ... D1, D0) into a control signal. The control signal is used to control the second switches (U0), ... (U$2^m$-2), (U$2^m$-1) of the first voltage-setting unit 33f such that one of the second switches (U0), ... (U$2^m$-2), (U$2^m$-1) is selected in accordance with the least (m) significant bits (Dm, ... D1, D0) of the n-bit digital signal (Dn–1, ... D1, D0) for connecting the corresponding one of the first resistive branches 33_1f, ... 33_$2^m$-1f, 33_$2^m$f to the first reference voltage source $V_1$. The control signal is further used to control the third switches (W0), ... (W$2^m$-2), (W$2^m$-1) of the second voltage-setting unit 34f such that one of the third switches (W0), ... (W$2^m$-2), (W$2^m$-1) is selected in accordance with the least (m) significant bits (Dm, ... D1, D0) of the n-bit digital signal (Dn–1, ... D1, D0) for connecting the corresponding one of the second resistive branches 34_1f, ... 34_$2^m$-1f, 34_$2m$ to the second reference voltage source $V_2$.

More particularly, the control signal is the hexadecimal value of the least (m) significant bits (Dm, ... D1, D0) of the n-bit digital signal (Dn–1, ... D1, D0). The second and third switches (U0), ... (U $2^m$*2), (U $2^m$-1), (W0), ... (W$2^m$-2), (W$2^m$-1) with subscripts that correspond to the hexadecimal value are closed such that the voltage difference ΔV between the first and second reference voltages $V_1$, $V_2$ is applied across the series-connected first resistors 30_1, ... 30_$2^{n-m}$-2. 30_$2^{n-m}$-1 and the corresponding first and second resistive branches 33_1f, ... 33_$2^m$-1f, 33_$2^m$f, 34_1f, ... 34_$2^m$-1f, 34_$2^m$. For example, when the hexadecimal value of the least (m) significant bits (Dm, ... D1, D0) of the n-bit digital signal (Dn–1, ... D1, D0) is "5", then the second switch (U5) and the third switch (W5) are closed such that the voltage difference ΔV is applied across the series-connected first resistors 30_1, ... 30_$2^{n-m}$-2, 30_$2^{n-m}$-1, the first resistive branch 33_6f, and the second resistive branch 34_6f.

In this embodiment, the first resistors 30_1, ... 30_$2^{n-m}$-2, 30_$2^{n-m}$-1 have equal first resistances (R1). The first resistive branches 33_1f, ... 33_$2^m$-1f, 33_$2^m$f have resistances that range in magnitude from the first resistance (R1) to $$\frac{1}{2^m}$$

of the first resistance (R1) and that vary from each other in units of $$\frac{1}{2^m}$$

of the first resistance (R1). In other words, the first resistive branches 33_1f, ... 33_$2^m$-1f, 33_$2^m$f have resistances of $$(R1), ... \left(\frac{2}{2^m}R1\right), \left(\frac{1}{2^m}R1\right),$$

respectively. The second resistive branches 34_1f, ... 34_$2^m$-1f, 34_$2^m$ have resistances that range in magnitude from 0 to $$\frac{2^m - 1}{2^m}$$

of the first resistance (R1) and that vary from each other in units of $$\frac{1}{2^m}$$

of the first resistance (R1). In other words, the second resistive branches 34_1f, ... 34_$2^m$-1f, 34_$2^m$ have resistances of $$0, ... \left(\frac{2^m - 2}{2^m}R1\right), \left(\frac{2^m - 1}{2^m}R1\right),$$

respectively.

After the (n–m)-bit decoder 311f converts the higher-order signal portion (Dn–1, ... , Dm) of the n-bit digital signal (Dn–1, ... D1, D0) into the decoder signal to control one of the first switches (S0), ... (S$2^{n-m}$-2), (S$2^{n-m}$-1) to close, voltage at the corresponding one of the second endmost, intermediate and first endmost nodes (m0), (m1~m$2^{n-1}$-2), (m$2^{n-1}$-1) of the resistor string 30f is obtained by voltage division, and is tapped to the output node $V_{out}$.

Therefore, according to the fifth preferred embodiment, to convert an n-bit digital signal (Dn–1, ... D1, D0) into its corresponding analog signal, the total number of resistors required is ($2^{n-m}$-1)+$2^m$×2=$2^{n-m}$+$2^{m+1}$-1, and the total number of switches required is $2^{n-m}$+$2^m$×2=$2^{n-m}$+$2^{m+1}$. In addition, only one (n–m)-bit decoder 311f and one m-bit decoder 35f are required for generating the decoder and control signals. As a result, chip size of the digital-to-analog converter 3f is reduced as compared to the prior art, thereby permitting application to high-resolution digital-to-analog conversions.

In sum, the digital-to-analog converter according to the present invention utilizes a relatively small number of resistors and switches such that chip size and manufacturing costs are reduced, and such that application to high-resolution digital-to-analog conversions is possible.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A digital-to-analog converter adapted for converting an n-bit digital signal into a corresponding analog signal, the n-bit digital signal including higher-order and lower-order signal portions, said digital-to-analog converter having an output node, and comprising:
a resistor string including a plurality of first resistors connected in series, said resistor string having first and second endmost nodes disposed respectively at two ends thereof, and a plurality of intermediate nodes, each disposed between a respective adjacent pair of said first resistors;
a plurality of first switches, each connected between said output node and a corresponding one of said first endmost, second endmost and intermediate nodes of said resistor string;
a decoding unit adapted for converting the higher-order signal portion of the n-bit digital signal into a decoder signal, the decoder signal being used to control said plurality of first switches such that one of said first switches is selected in accordance with the higher-order signal portion of the n-bit digital signal to connect the corresponding one of said first endmost, second endmost and intermediate nodes to said output node;
a first voltage-setting unit adapted to be connected between a first reference voltage source and said first endmost node of said resistor string;
a second voltage-setting unit adapted to be connected between a second reference voltage source and said second endmost node of said resistor string;
said first voltage-setting unit includes a second switch adapted to connect the first reference voltage source to said first endmost node of said resistor string, a third switch adapted to be connected to the first reference voltage source, and a second resistor connected directly to said first endmost node of said resistor string and adapted to be connected to the first reference voltage source via said third switch;
said second voltage-setting unit includes third and fourth resistors connected in series, said third resistor being further connected directly to said second endmost node of said resistor string, said second voltage-setting unit further including a fourth switch adapted to connect the second reference voltage source to one node of said fourth resistor opposite to said third resistor, and a fifth switch adapted to connect the second reference voltage source to a junction of said third and fourth resistors; and
wherein said first and second voltage-setting units are operable in response to the lower-order signal portion of the n-bit digital signal to adjust voltages at said first endmost, second endmost and intermediate nodes of said resistor string according to the lower-order signal portion of the n-bit digital signal, and wherein the lower-order signal portion is a least significant bit of the n-bit digital signal.

2. The digital-to-analog converter as claimed in claim 1, wherein said first resistors have equal first resistances, and said second, third and fourth resistors have equal second resistances, the second resistance being one-half of the first resistance.

3. The digital-to-analog converter as claimed in claim 2, wherein:
said second and fourth switches are closed and said third and fifth switches are opened when the least significant bit of the n-bit digital signal is a logic low bit; and
said second and fourth switches are opened and said third and fifth switches are closed when the least significant bit of the n-bit digital signal is a logic high bit.

4. The digital-to-analog converter as claimed in claim 3, wherein said plurality of first switches includes:
a first set of said first switches, each connected between said output node and one of said first endmost, second endmost, and intermediate nodes of said resistor string; and
a second set of said first switches, each connected between said output node, and one of said second endmost and intermediate nodes of said resistor string and said one node of said fourth resistor opposite to said third resistor.

5. The digital-to-analog converter as claimed in claim 4, wherein said decoding unit includes:
a first decoder enabled when the least significant bit of the n-bit digital signal is a logic high bit to convert the higher-order signal portion of the n-bit digital signal into the decoder signal that is used to control said first set of said first switches; and
a second decoder enabled when the least significant bit of the n-bit digital signal is a logic low bit to convert the higher-order signal portion of the n-bit digital signal into the decoder signal that is used to control said second set of said first switches.

6. A digital-to-analog converter adapted for converting an n-bit digital signal into a corresponding analog signal, the n-bit digital signal including higher-order and lower-order signal portions, said digital-to-analog converter having an output node, and comprising:
a resistor string including a plurality of first resistors connected in series, said resistor string having first and second endmost nodes disposed respectively at two ends thereof, and a plurality of intermediate nodes, each disposed between a respective adjacent pair of said first resistors;
a plurality of first switches, each connected between said output node and a corresponding one of said first endmost, second endmost and intermediate nodes of said resistor string;
a decoding unit adapted for converting the higher-order signal portion of the n-bit digital signal into a decoder signal, the decoder signal being used to control said plurality of first switches such that one of said first switches is selected in accordance with the higher-order signal portion of the n-bit digital signal to connect the corresponding one of said first endmost, second endmost and intermediate nodes to said output node;
a first voltage-setting unit adapted to be connected between a first reference voltage source and said first endmost node of said resistor string;
a second voltage-setting unit adapted to be connected between a second reference voltage source and said second endmost node of said resistor string;
said first voltage-setting unit includes second and third resistors connected directly to said first endmost node of said resistor string, and second and third switches adapted to connect said second and third resistors respectively to the first reference voltage source;

said second voltage-setting unit includes a fourth switch and a fourth resistor each of which is adapted to connect said second endmost node of said resistor string to the second reference voltage sources; and wherein said first and second voltage-setting units are operable in response to the lower-order signal portion of the n-bit digital signal to adjust voltages at said first endmost, second endmost and intermediate nodes of said resistor string according to the lower-order signal portion of the n-bit digital signal, and wherein the lower-order signal portion is a least significant bit of the n-bit digital signal.

7. The digital-to-analog converter as claimed in claim 6, wherein said first and second resistors have equal first resistances, and said third and fourth resistors have equal second resistances, the second resistance being one-half of the first resistance.

8. The digital-to-analog converter as claimed in claim 7, wherein:

said second and fourth switches are closed and said third switch is opened when the least significant bit of the n-bit digital signal is a logic low bit; and said second and fourth switches are opened and said third switch is closed when the least significant bit of the n-bit digital signal is a logic high bit.

9. A digital-to-analog converter adapted for converting an n-bit digital signal into a corresponding analog signal, the n-bit digital signal including higher-order and lower-order signal portions, said digital-to-analog converter having an output node, and comprising:

a resistor string including a plurality of first resistors connected in series, said resistor string having first and second endmost nodes disposed respectively at two ends thereof, and a plurality of intermediate nodes, each disposed between a respective adjacent pair of said first resistors;

a plurality of first switches, each connected between said output node and a corresponding one of said first endmost, second endmost and intermediate nodes of said resistor string;

a decoding unit adapted for converting the higher-order signal portion of the n-bit digital signal into a decoder signal, the decoder signal being used to control said plurality of first switches such that one of said first switches is selected in accordance with the higher-order signal portion of the n-bit digital signal to connect the corresponding one of said first endmost, second endmost and intermediate nodes to said output node;

a first voltage-setting unit adapted to be connected between a first reference voltage source and said first endmost node of said resistor string;

a second voltage-setting unit adapted to be connected between a second reference voltage source and said second endmost node of said resistor string;

said first voltage-setting unit includes a second switch adapted to be connected to the first reference voltage source, a second resistor connected directly to said first endmost node of said resistor string and adapted to be connected to the first reference voltage source via said second switch, and a third resistor adapted to connect directly said first endmost node of said resistor string to the first reference voltage source;

said second voltage-setting unit includes a third switch and a fourth resistor each of which is adapted to connect said second endmost node of said resistor string to the second reference voltage source; and wherein said first and second voltage-setting units are operable in response to the lower-order signal portion of the n-bit digital signal to adjust voltages at said first endmost, second endmost and intermediate nodes of said resistor string according to the lower-order signal portion of the n-bit signal, and wherein the lower-order signal portion is a least significant bit of then n-bit digital signal.

10. The digital-to-analog converter as claimed in claim 9, wherein said first, second and third resistors have equal first resistances, and said fourth resistor has a second resistance equal to one-half of the first resistance.

11. The digital-to-analog converter as claimed in claim 10, wherein said second and third switches are closed when the least significant bit of the n-bit digital signal is a logic low bit, and are opened when otherwise.

12. The digital-to-analog converter adapted for converting an n-bit digital signal into a corresponding analog signal, the n-bit digital signal including higher-order and lower-order signal portions, said digital-to-analog converter having an output node, and comprising:

a resistor string including a plurality of first resistors connected in series, said resistor string having first and second endmost nodes disposed respectively at two ends thereof, and a plurality of intermediate nodes, each disposed between a respective adjacent pair of said first resistors;

a plurality of first switches, each connected between said output node and a corresponding one of said first endmost, second endmost and intermediate nodes of said resistor string;

a decoding unit adapted for converting the higher-order signal portion of the n-bit digital signal into a decoder signal, the decoder signal being used to control said plurality of first switches such that one of said first switches is selected in accordance with the higher-order signal portion of the n-bit digital signal to connect the corresponding one of said first endmost, second endmost and intermediate nodes to said output node;

a first voltage-setting unit adapted to be connected between a first reference voltage source and said first endmost node of said resistor string, wherein said first voltage-setting unit includes a second resistor string including four second resistors connected in series and having first and second terminating nodes and three first middle nodes each disposed between a respective adjacent pair of said second resistors, said second terminating node being connected directly to said first endmost node of said resistor string, and a first switch set including four second switches each adapted to connect a corresponding one of said first terminating and first middle nodes to the first reference voltage source; and said second voltage-setting unit includes a third resistor string including three third resistors connected in series and having third and fourth terminating nodes and two second middle nodes each disposed between a respective adjacent pair of said third resistors, said third terminating node being connected directly to said second endmost node of said resistor string, and a second switch set including four third switches each adapted to connect a corresponding one of said third terminating, fourth terminating and second middle nodes to the second reference voltage source; and a second voltage-setting unit adapted to be connected between a second reference voltage source and said second endmost node of said resistor string;

wherein said first and second voltage-setting units are operable in response to the lower-order signal portion of the n-bit digital signal to adjust voltages at said first endmost, second endmost and intermediate nodes of said resistor string according to the lower-order signal portion of the n-bit digital signal, and wherein the lower-order signal portion is the least two significant bits of the n-bit digital signal.

13. The digital-to-analog converter as claimed in claim 12, further comprising a second decoder for converting the least two significant bits of the n-bit digital signal into a control signal, the control signal being used to control said second switches such that one of said second switches is selected in accordance with the least two significant bits of the n-bit digital signal for connecting the corresponding one of said first terminating and first middle nodes to the first reference voltage source, the control signal being further used to control said third switches such that one of said third switches is selected in accordance with the least two significant bits of the n-bit digital signal for connecting the corresponding one of said third terminating, fourth terminating and second middle nodes to the second reference voltage source.

14. The digital-to-analog converter as claimed in claim 13, wherein said first resistors have equal first resistances, and said second and third resistors have equal second resistances, the second resistance being one-fourth of the first resistance.

15. The digital-to-analog converter adapted for converting an n-bit digital signal into a corresponding analog signal, the n-bit digital signal including higher-order and lower-order signal portions, said digital-to-analog converter having an output node, and comprising:

a resistor string including a plurality of first resistors connected in series, said resistor string having first and second endmost nodes disposed respectively at two ends thereof, and a plurality of intermediate nodes, each disposed between a respective adjacent pair of said first resistors;

a plurality of first switches, each connected between said output node and a corresponding one of said first endmost, second endmost and intermediate nodes of said resistor string;

a decoding unit adapted for converting the higher-order signal portion of the n-bit digital signal into a decoder signal, the decoder signal being used to control said plurality of first switches such that one of said first switches is selected in accordance with the higher-order signal portion of the n-bit digital signal to connect the corresponding one of said first endmost, second endmost and intermediate nodes to said output node;

a first voltage-setting unit adapted to be connected between a first reference voltage source and said first endmost node of said resistor string, wherein said first voltage-setting unit includes $2^m$ second switches adapted to be connected to the first reference voltage source, and $2^m$ first resistive branches connected directly to said first endmost node of said resistor string and adapted to be connected to the first reference voltage source via a corresponding one of said second switches; and said second voltage-setting unit includes $2^m$ third switches adapted to be connected to the second reference voltage source, and $2^m$ second resistive branches connected directly to said second endmost node of said resistor string and adapted to be connected to the second reference voltage source via a corresponding one of said third switches; and a second voltage-setting unit adapted to be connected between a second reference voltage source and said second endmost node of said resistor string;

wherein said first and second voltage-setting units are operable in response to the lower-order signal portion of the n-bit digital signal to adjust voltages at said first endmost, second endmost and intermediate nodes of said resistor string according to the lower-order signal portion of the n-bit digital signal, and wherein the lower-order signal portion is the least (m) significant bits of the n-bit digital signal, where m is a positive integer less than n.

16. The digital-to-analog converter as claimed in claim 15, further comprising a second decoder for converting the least (m) significant bits of the n-bit digital signal into a control signal, the control signal being used to control said second switches such that one of said second switches is selected in accordance with the least (m) significant bits of the n-bit digital signal for connecting the corresponding one of said first resistive branches to the first reference voltage source, the control signal being further used to control said third switches such that one of said third switches is selected in accordance with the least (m) significant bits of the n-bit digital signal for connecting the corresponding one of said second resistive branches to the second reference voltage source.

17. The digital-to-analog converter as claimed in claim 16, wherein said first resistors have equal first resistances.

18. The digital-to-analog converter as claimed in claim 17, wherein said first resistive branches have resistances that range in magnitude from the first resistance to $\frac{1}{2^m}$ of the first resistance and that vary from each other in units of $\frac{1}{2^m}$ of the first resistance.

19. The digital-to-analog converter as claimed in claim 18, wherein said second resistive branches have resistances that range in magnitude from 0 to $(2^m-1)/2^m$ of the first resistance and that vary from each other in units of $\frac{1}{2^m}$ of the first resistance.

* * * * *